United States Patent
Sambongi (10) Patent No.: US 9,756,304 B2
(45) Date of Patent: Sep. 5, 2017

(54) IMAGE-ACQUISITION APPARATUS FOR PERFORMING DISTANCE MEASUREMENT USING PARALLAX

(71) Applicant: OLYMPUS CORPORATION, Shibuya-ku, Tokyo (JP)

(72) Inventor: Masao Sambongi, Tama (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 14/677,456

(22) Filed: Apr. 2, 2015

(65) Prior Publication Data

US 2015/0215593 A1 Jul. 30, 2015

Related U.S. Application Data (63) Continuation of application No. PCT/JP2013/076603, filed on Sep. 30, 2013.

(30) Foreign Application Priority Data

Oct. 5, 2012 (JP) ................................ 2012-223212

(51) Int. Cl.
G03B 13/00 (2006.01)
H04N 9/64 (2006.01)
(Continued)

(52) U.S. Cl.
CPC ................. H04N 9/64 (2013.01); G01C 3/08 (2013.01); H04N 5/2254 (2013.01); H04N 9/04 (2013.01);
(Continued)

(58) Field of Classification Search
None
See application file for complete search history.

(56) References Cited

U.S. PATENT DOCUMENTS 6,396,873 B1    5/2002   Goldstein et al.
7,936,392 B2 *  5/2011   Ng ....................... G02B 3/0056
                                                      348/349
(Continued)

FOREIGN PATENT DOCUMENTS

JP    2003523646 A    8/2003
JP    2007086720 A    4/2007
(Continued)

OTHER PUBLICATIONS

International Search Report (ISR) and Written Opinion (WO) dated Nov. 12, 2013 issued in International Application No. PCT/JP2013/076603.

(Continued)

Primary Examiner — Twyler Haskins
Assistant Examiner — Wesley Chiu
(74) Attorney, Agent, or Firm — Holtz, Holtz & Volek PC (57) ABSTRACT

Provided is an image-acquisition apparatus including an image-acquisition lens that collects light coming from a subject A; an image-acquisition device that acquires images with the light collected by the image-acquisition lens; a microlens array that is disposed between the image-acquisition device and the image-acquisition lens; and a distance calculating portion that calculates a distance to the subject by using information obtained by the image-acquisition device. The microlens array has multiple types of microlenses, for different polarization states, that focus light incident thereon to form individual images on an image-acquisition surface of the image-acquisition device and that are arranged in an array in directions orthogonal to an optical axis thereof, and the distance calculating portion calculates the distance by performing matching processing in which each polarization state is weighted according to frequency (Continued)

components of the information obtained by the image-acquisition device.

5 Claims, 7 Drawing Sheets

(51) Int. Cl.
    *G01C 3/08*     (2006.01)
    *H04N 5/225*     (2006.01)
    *H04N 9/04*     (2006.01)
    *H04N 13/02*     (2006.01)
    *H04N 13/00*     (2006.01)
    *H01L 27/146*     (2006.01)

(52) U.S. Cl.
    CPC ......... *H04N 9/045* (2013.01); *H04N 13/0232* (2013.01); *H01L 27/14627* (2013.01); *H04N 13/0217* (2013.01); *H04N 13/0257* (2013.01); *H04N 2013/0081* (2013.01)

(56) References Cited

U.S. PATENT DOCUMENTS

| | | | |
|---|---|---|---|
| 7,962,033 B2 | 6/2011 | Georgiev et al. | |
| 2010/0045815 A1* | 2/2010 | Tsuchiya | H04N 5/23238 348/222.1 |
| 2010/0066812 A1* | 3/2010 | Kajihara | G03B 15/00 348/46 |
| 2011/0199458 A1* | 8/2011 | Hayasaka | G06T 7/0075 348/43 |
| 2012/0120305 A1* | 5/2012 | Takahashi | H04N 5/23203 348/352 |
| 2012/0154651 A1 | 6/2012 | Ohno | |
| 2012/0176506 A1* | 7/2012 | Tajiri | H04N 5/2254 348/222.1 |
| 2012/0218448 A1 | 8/2012 | Ueno et al. | |
| 2012/0281072 A1* | 11/2012 | Georgiev | G03B 11/00 348/49 |
| 2013/0075585 A1* | 3/2013 | Kobayashi | H01L 27/146 250/208.1 |
| 2013/0076968 A1* | 3/2013 | Ueda | H04N 5/343 348/345 |

FOREIGN PATENT DOCUMENTS

| | | |
|---|---|---|
| JP | 2011085539 A | 4/2011 |
| JP | 4752031 B2 | 8/2011 |
| JP | 2012142918 A | 7/2012 |
| JP | 2012178693 A | 9/2012 |
| JP | 2013074400 A | 4/2013 |
| WO | 0050927 A2 | 8/2000 |
| WO | 2011049149 A1 | 4/2011 |

OTHER PUBLICATIONS

Ng R, et al., "Light Field Photography with a Hand-held Plenoptic Camera", Stanford Tech. Report CTSR Feb. 2005, 11 Pages.
Shigetomi T, et al., "3D Reconstruction from Using Stereo Polarization", MIRU Jul. 2010, IS2-18, pp. 880-887.

* cited by examiner

| M1 i (x, y) | | | M2 i (u, v) | | |
|---|---|---|---|---|---|
| | | | | | |
| | | | | | |

IMAGE-ACQUISITION APPARATUS FOR PERFORMING DISTANCE MEASUREMENT USING PARALLAX

CROSS-REFERENCE TO RELATED APPLICATIONS

This is a continuation of International Application PCT/JP2013/076603, with an international filing date of Sep. 30, 2013, which is hereby incorporated by reference herein in its entirety.

This application is based on Japanese Patent Application No. 2012-223212, filed on Oct. 5, 2012, the contents of which are incorporated herein by reference.

TECHNICAL FIELD

The present invention relates to an image-acquisition apparatus.

BACKGROUND ART

In the related art, there are known image-acquisition methods that are capable of performing distance measurement using parallax images (for example, see Patent Literature 1).

With this method, parallax images having multiple types of polarization information are acquired in a single image-acquisition shot, and polarization analysis is performed.

CITATION LIST

Patent Literature

{PTL 1}
Japanese Unexamined Patent Application, Publication No. 2007-86720

SUMMARY OF INVENTION

Solution to Problem

An aspect of the present invention provides an image-acquisition apparatus including an image-acquisition lens that collects light coming from a subject; an image-acquisition device that acquires an image with the light collected by the image-acquisition lens; a microlens array that is disposed between the image-acquisition device and the image-acquisition lens; and a distance calculating portion that calculates a distance to the subject by using information obtained by the image-acquisition device; wherein the microlens array has a plurality of types of microlenses, for different polarization states, that focus light incident thereon to form individual images on an image-acquisition surface of the image-acquisition device and that are arranged in an array in directions orthogonal to an optical axis thereof, and the distance calculating portion calculates the distance by performing matching processing in which each polarization state is weighted according to frequency components in the information obtained by the image-acquisition device.

DESCRIPTION OF EMBODIMENT

An image-acquisition apparatus according to an embodiment of the present invention will be described below with reference to the drawings.

Figure 1:
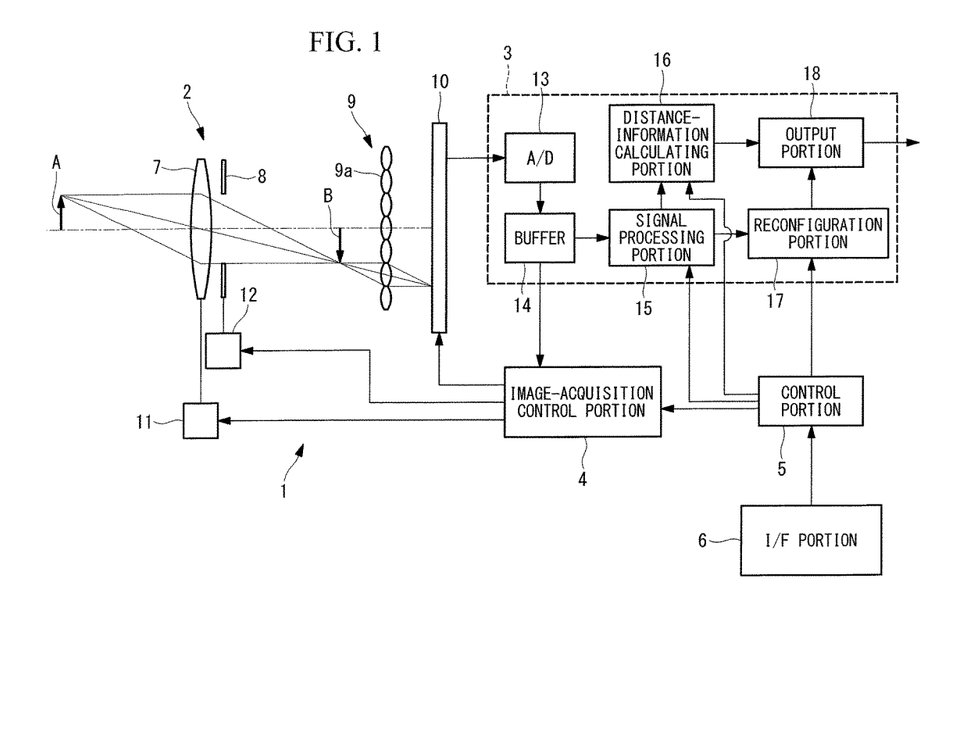
FIG. 1 is a diagram showing the overall configuration of an image-acquisition apparatus according to an embodiment of the present invention.

As shown in FIG. 1, an image-acquisition apparatus 1 according to this embodiment includes an image-acquisition portion 2 that acquires images of a subject A, an image processing portion 3 that processes image signals obtained by the image-acquisition portion 2, an image-acquisition control portion 4 that controls the image-acquisition portion 2, a control portion 5 that controls the image processing portion 3 and the image-acquisition control portion 4, and an I/F portion 6 via which external signals are input to the control portion 5.

The image-acquisition portion 2 includes, in the following order from the subject A side, an image-acquisition lens 7 that is disposed facing the subject A, an aperture diaphragm 8 that determines the beam diameter of light passing through the image-acquisition lens 7, a microlens array 9 disposed in a direction away from the subject A in the optical axis direction with a gap relative to a real image B formed at a back focal position of the image-acquisition lens 7, and an image-acquisition device 10 that is disposed farther in the optical axis direction away from the microlens array 9 and that acquires images of the light passing through the microlens array 9.

An AF motor 11 is connected to the image-acquisition lens 7. The image-acquisition lens 7 is moved in the optical-axis direction by the AF motor 11 that is driven in response to a command signal from the image-acquisition control portion 4, so that the subject A is aligned with the front focal point. In FIG. 1, although the image-acquisition lens 7 is shown as a single lens, in reality, it is formed of a plurality of lenses arranged in the optical-axis direction, and at least one of these lenses is moved in the optical-axis direction by the AF motor 11.

A degree-of-opening adjustment motor 12 is connected to the aperture diaphragm 8. The degree of opening of the aperture diaphragm 8 is adjusted by the degree-of-opening adjustment motor 12 that is driven in response to a command signal from the image-acquisition control portion 4, thus adjusting the amount of incident light.

Figure 2:
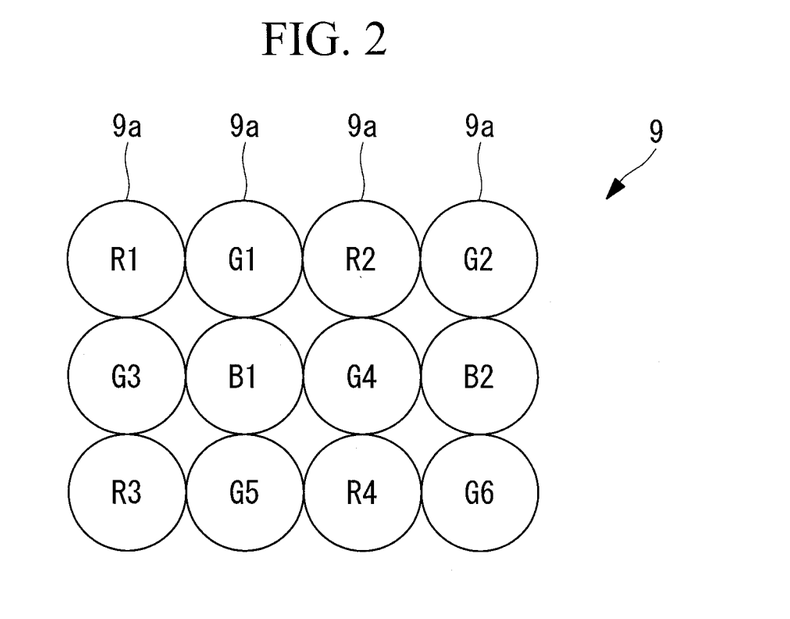
FIG. 2 is a front view showing an example of a microlens array provided in the image-acquisition apparatus in FIG. 1.

As shown in FIG. 2, the microlens array 9 is configured by arraying a plurality of microlenses 9a in diametrical directions. The microlenses 9a are provided with color filters having different wavelength transmittances, and the other optical characteristics are the same. As shown in FIG. 2, for example, microlenses 9a to which respective color filters having wavelength transmittances that transmit red (R1, R2, R3, and R4), green (G1, G2, G3, G4, G5, and G6), and blue (B1 and B2) are attached are arrayed in the form of, for example, a Bayer array.

Figure 4:
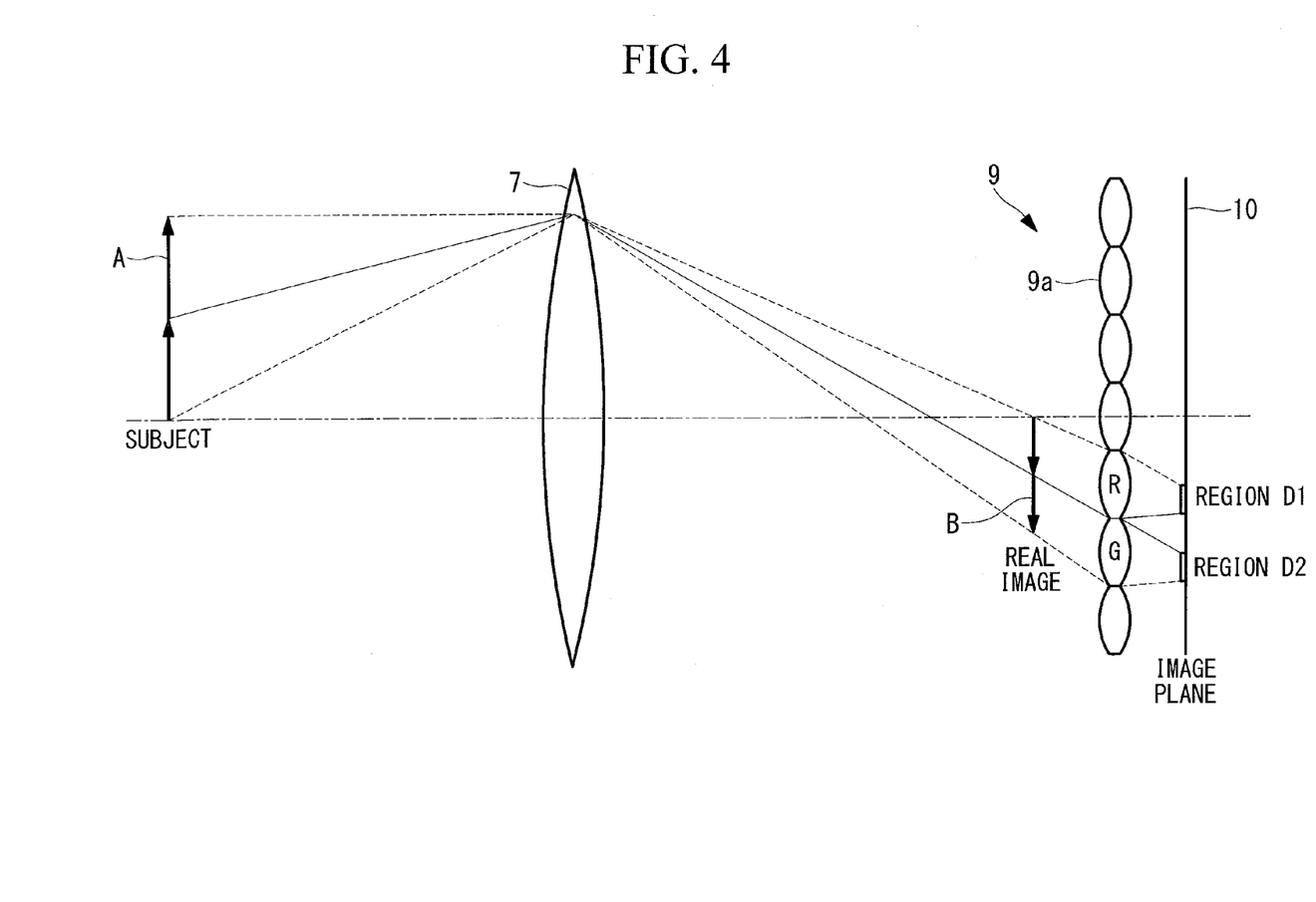
FIG. 4 is a side view for explaining the operation of the microlens array in FIG. 2.
Figure 5:
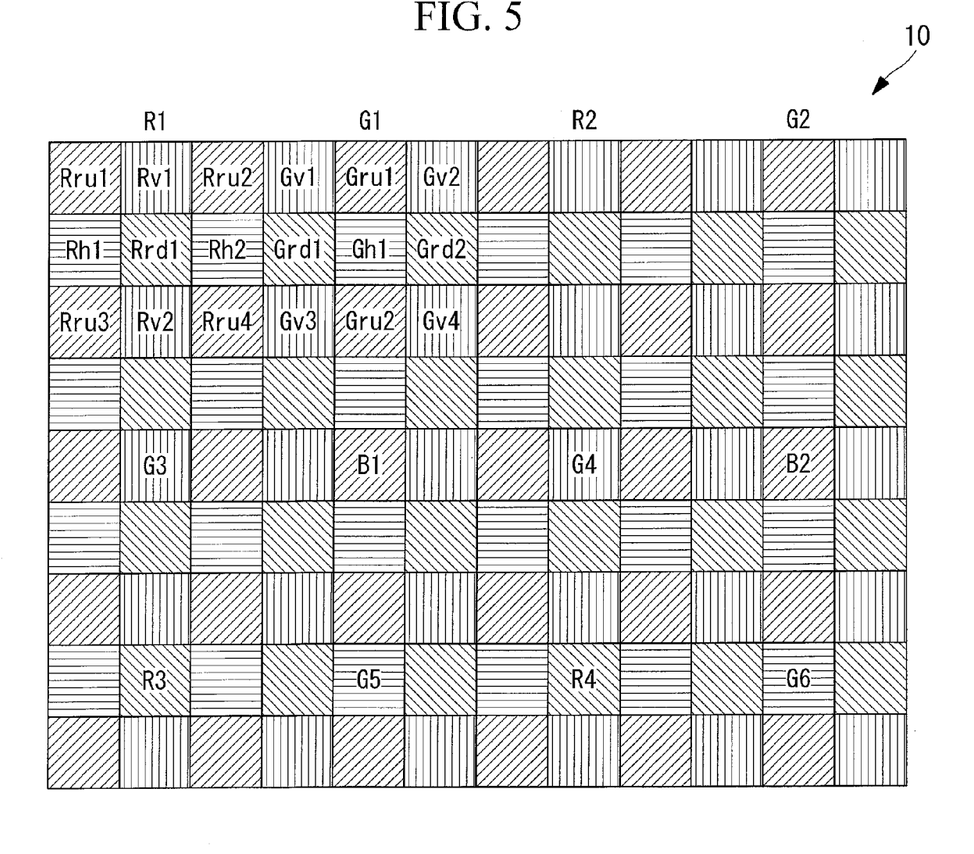
FIG. 5 is a diagram showing the polarization states and color information obtained in regions of an image-acquisition device corresponding to the microlens array in FIG. 2.

As shown in FIG. 4, light from the subject is focused by the image-acquisition lens and is imaged in a region corresponding to each microlens on the image-acquisition surface of the image-acquisition device by each microlens. More specifically, the region corresponding to each microlens 9a is provided with, for example, 3×3=9 pixels, as shown in FIG. 5.

The image-acquisition device is a polarized-light image-acquisition device in which a polarizing filter that transmits light having any of four polarized light components is provided at each pixel and in which the polarizing filters are arrayed so that the polarized light components that pass through neighboring pixels are different. Explaining this using FIG. 5, Rrui (i=1 to 4), Rvj (j=1, 2), Rhk (k=1, 2), and Rrd1 are R pixels having four polarization states, and Grui (i=1, 2), Gvj (j=1 to 4), Gh1, and Grd1 (l=1, 2) are G pixels having four polarization states.

As shown in FIG. 1, the image processing portion 3 includes an A/D converter 13 that converts the image signal detected by the image-acquisition device 10 into a digital signal, a buffer 14 that temporarily stores the image signals that have been converted to digital signals, a signal processing portion 15 that processes single-plane image signals stored in the buffer 14 and generates a 12-plane image signal, a distance-information calculating portion 16 that uses the image signal generated by the signal processing portion 15 to calculate distance information from the image-acquisition lens 7 to the subject A, a reconfiguration portion 17 that generates a 1-plane image signal from the signal processed by the signal processing portion 15, and an output portion 18.

The signal processing portion 15 reads single-plane image signals in the buffer 14 on the basis of a command signal from the control portion 5 and performs the following processing.

First, regarding the polarization states, using four pixels with the same polarization states, Rru1, Rru2, Rru3, and Rru4, in the R region, known bilinear or bicubic interpolation processing is performed to interpolate pixels having other polarization states. Also, for Rv1 and Rv2, and Rh1 and Rh2, interpolation processing is similarly performed using two pixels. Regarding Rrd1, information of this pixel is assigned to a pixel of another polarization state.

The same processing is also performed in the G and B regions, generating a signal in which the four polarization states exist at one pixel.

Next, regarding the color signal, in the case of FIG. 5, color interpolation processing is performed in units of 3×3 regions having the same color signal. For example, averaging processing is performed on 3×3 regions having the same polarization state in the G signal region. Specifically, averaging processing is performed in the 3×3 regions G1, G2, G3, G4, G5, and G6. When the G signal after the averaging processing is defined as gi (i=1 to 6), the G signal in the B1 region, gB1, is calculated as shown in Equation (1) by using the signals of the four regions neighboring the B1 region.

$$gB1=(g1+g3+g4+g5)/4 \quad (1)$$

The same processing is also performed on the other signals.

As a result of the color interpolation processing, the four polarization states and the RGB signal information are assigned to one pixel, forming an image signal with 12 planes in total.

In the distance-information calculating portion 16, calculation of distance information is performed using the 12-plane image signal generated by the signal processing portion 15.

Figure 3:
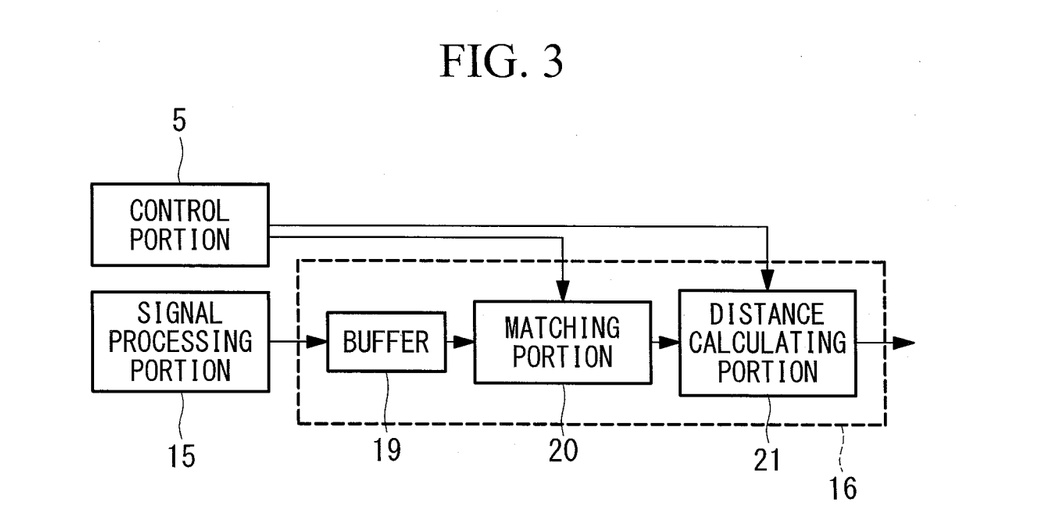
FIG. 3 is a block diagram showing a distance-information calculating portion provided in the image-acquisition apparatus in FIG. 1.

As shown in FIG. 3, the distance-information calculating portion 16 includes a buffer 19 that temporarily stores the 12-plane image signal sent from the signal processing portion 15, a matching portion 20 that performs matching processing using the image signal stored in the buffer 19, and a distance-calculating portion 21 that calculates, for each microlens 9a, the distance from the image-acquisition lens 7 to the subject A by using coordinate values determined by the matching portion 20.

Figure 6:
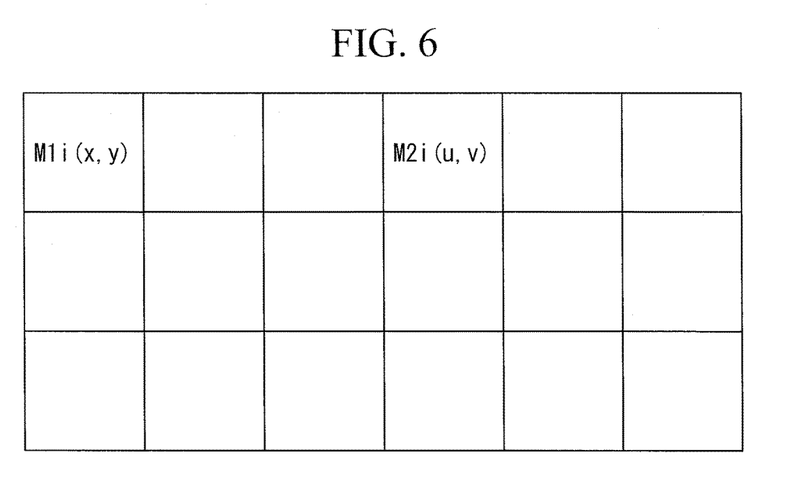
FIG. 6 is a diagram showing an image signal after interpolation in a signal processing portion in the image-acquisition apparatus in FIG. 1.

With the image-acquisition apparatus 1 according to this embodiment, shown in FIG. 1, since parallax information is obtained at each microlens 9a, matching processing is performed on pixel regions corresponding to neighboring microlenses 9a in the matching portion 20. FIG. 6 shows the image signal after interpolation, in which M1i(x, y) is the image signal at coordinates (x, y), where i=(rp1, rp2, rp3, rp4, gp1, gp2, gp3, gp4, bp1, bp2, bp3, and bp4). Here, r, g, and b indicate the respective color information, and p1, p2, p3, and p4 indicate the respective polarization states.

The matching portion 20 performs matching processing on signal M2i(u, v) of adjacent microlenses 9a by using a matching evaluation value S shown in Equation (2). Here, M2i(u, v) is the image signal at coordinates (u, v). The matching processing is processing for finding coordinates (u, v) at which the matching evaluation value S in Equation (2) is minimized. The matching processing is performed in the neighboring regions at coordinates (x, y) and (u, v), and is performed by finding the coordinates (u, v) at which the matching evaluation value S in, for example, a 2×2 region is minimized.

$$S = \sum_{i=1}^{4} \sum_{x,y,u,v} \alpha_i \|M1g_{pi}(x, y) - M2g_{pi}(u, v)\| \quad (2)$$

Equation (2) involves only the G signal in order to simplify the description. Reference sign αi in Equation (2) represents a weighting coefficient. By using a weighting coefficient, it is possible to increase the contribution of a certain polarization state to the matching evaluation value S.

In this embodiment, for the brightness information of the image signal for a certain polarization state, an edge quantity is calculated for each pixel, and the weighting coefficient is calculated on the basis of that edge quantity.

If the edge quantity is large, many texture components are contained in those pixels, and therefore, the weighting coefficient is set high. If the edge quantity is small, almost no texture components are contained, and therefore, the weighting coefficient is set low.

The coordinate values obtained as a result of the matching processing in the matching portion 20 are sent to the distance calculating portion 21, where a distance Z between the image-acquisition lens 7 and the subject A is calculated using Equation (3) below:

$$Z=z/M=2f\Phi(x-u) \quad (3)$$

Here, f is the focal length of a microlens 9a, Φ is the effective diameter of the microlens 9a, and x and u are the coordinate values in the x-direction of the corresponding pixels in the two pixel regions.

The distance information calculated in the distance calculating portion 21 is sent to the output portion 18.

On the other hand, in the reconfiguration portion 17, a single-plane image signal is created from the image signal processed by the signal processing portion 15 and is output to the output portion 18.

Explaining this using FIG. 4, image signals for regions D1 and D2 that have passed through the microlenses 9a are extracted, and an image signal of the subject A is created. In this case, the subject A results in an image signal in which the subject A is observed from the edge of the image-acquisition lens 7. If regions other than the regions D1 and D2 are extracted to create an image signal, it is possible to create an image signal in which the subject A is observed from different locations on the image-acquisition lens 7.

In other words, it is possible to create multiple parallax image signals that pass through various positions of the image-acquisition lens 7 depending on the position of the region to be extracted.

The image signal may be RGB signals of a certain polarization state, or may be RGB signals in which four polarization states are averaged. By the above processing, a single-plane image signal is created.

The operation of the thus-configured image-acquisition apparatus 1 according to this embodiment will be described below.

To measure the distance Z between the subject A and the image-acquisition lens 7 by using the image-acquisition apparatus 1 according to this embodiment, after setting the image-acquisition conditions, such as the ISO sensitivity and exposure, via the I/F portion 6, a precapture mode is entered by half-pressing a shutter button (not illustrated). The light from the subject A enters the image-acquisition portion 2 via the image-acquisition lens 7 and, after forming a real image B, is focused by the microlens array 9 and is acquired by the image-acquisition device 10. The image signal obtained by the image-acquisition device 10 is converted to a digital signal by the A/D converter 13 and is then sent to the buffer 14, where it is stored.

The image signal stored in the buffer 14 is sent to the image-acquisition control portion 4. The image-acquisition control portion 4 controls the degree-of-opening adjustment motor 12 of the aperture diaphragm 8 using the brightness levels in the image signal sent thereto and controls the electronic shutter speed of the image-acquisition device 10. Also, the image-acquisition control portion 4 controls the AF motor 11 of the image-acquisition lens 7, calculates a contrast value in a prescribed region from the image signal, and sets the image-acquisition lens 7 to a prescribed focal distance so that this contrast value is maximized.

In this state, by fully pressing the shutter button, main image acquisition is performed. The main image acquisition is performed on the basis of the focal distance and the exposure conditions determined in the image-acquisition control portion 4, and the obtained image signal is converted to a digital signal by the A/D converter 13 and is sent to the buffer 14, where it is stored. Subsequently, the image signal in the buffer 14 is sent to the signal processing portion 15.

In the signal processing portion 15, a single-plane image signal sent thereto from inside the buffer 14 is subjected to processing for interpolating the polarization state and the color signal, and a twelve-plane image signal in which information on the four polarization states and the RGB signals are assigned to each pixel is created. The created image signal is sent to the distance-information calculating portion 16.

In the distance-information calculating portion 16, the image signal sent thereto from the signal processing portion 15 is stored in the buffer 19. Then, the image signal stored in the buffer 19 is subjected to matching processing for the subject A, in the matching portion 20, and coordinate values corresponding to a plurality of parallax images are calculated.

In this case, in the matching portion 20, matching processing is performed by calculating an edge quantity at each pixel, setting a weighting coefficient $\alpha i$ on the basis of the magnitude of the edge quantity, using the set weighting coefficient $\alpha i$ to calculate a matching evaluation value S, and searching for coordinates at which the matching evaluation value S is minimized.

With the image-acquisition apparatus according to this embodiment, since the matching evaluation value S is calculated using the weighting coefficient $\alpha i$ which is set to a larger value as the magnitude of the edge quantity increases, information of pixels containing many texture components is evaluated with a large weighting. As a result, an advantage is afforded in that the precision of the matching processing is improved, and it is possible to also perform high-precision distance calculation, which is performed using this result.

In addition, with the image-acquisition apparatus 1 according to this embodiment, it is possible to obtain polarization information and color information with a single image acquisition, which enables processing that makes use of the polarization information and color information, making it possible to perform high-precision distance measurement. Also, an advantage is afforded in that it is possible to obtain a color image at the same time as distance measurement is performed.

In this embodiment, it has been assumed that the microlenses are provided with color filters having different wavelength transmittances and that a color image can be obtained at the same time as distance measurement; however, this configuration is not essential. If it is assumed that no color filters are provided, there is no change in that, since the obtained information forms parallax images having a plurality of polarization states, it is still possible to perform high-precision distance measurement by calculating an edge quantity at each pixel and performing weighting.

Figure 7:
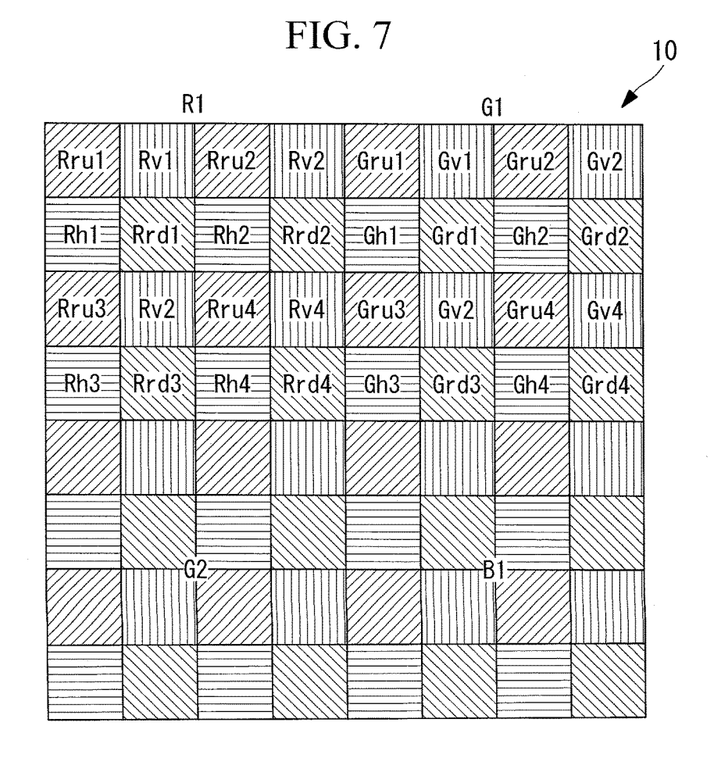
FIG. 7 is a diagram showing a modification of FIG. 5.

This embodiment has been described in terms of an example in which 3×3=9 pixels exist in the region corresponding to each microlens; instead of this, however, as shown in FIG. 7, in the case where 4×4=16 pixels exist in the region corresponding to each microlens 9a, sets of four pixels with four types of polarization states exist in each of the R, G, and B regions. In this case also, similarly to the situation described above, using four pixels in which the polarization states are the same, known bilinear or bicubic interpolation processing should be performed to interpolate the pixels of other polarization states.

Figure 8:
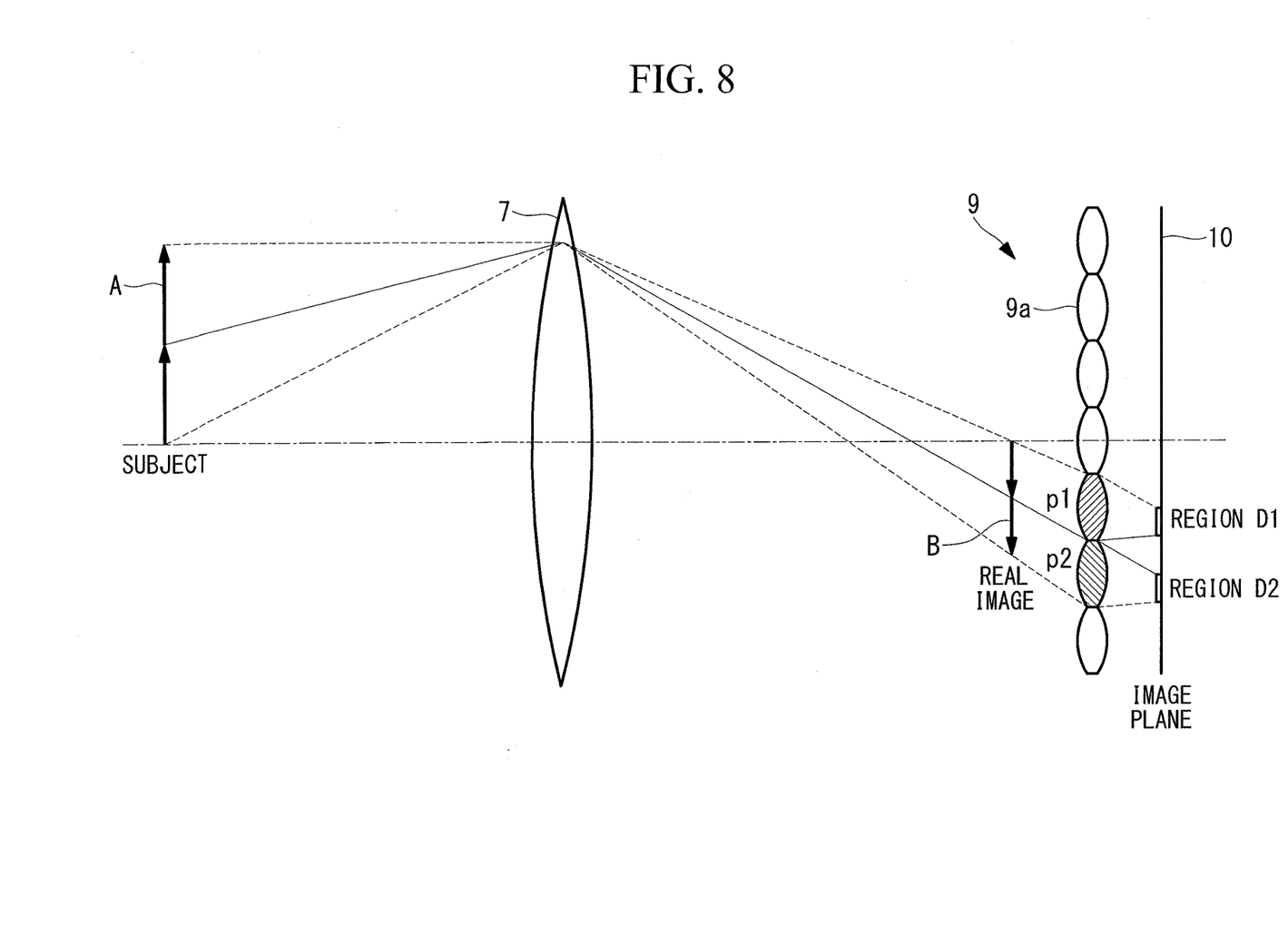
FIG. 8 is a side view, similar to FIG. 4, of a modification of the image-acquisition apparatus in FIG. 1.

In this embodiment, the individual microlenses 9a are provided with color filters having different wavelength transmittances, and a polarized-light image-acquisition device is employed as an image-acquisition device; instead of this, however, as shown in FIG. 8, the individual microlenses 9a may be provided with polarized-light filters that pass light of different polarization states, and a color image-acquisition device in which color filters are arranged in a Bayer array may be employed as the image-acquisition device.

Figure 9:
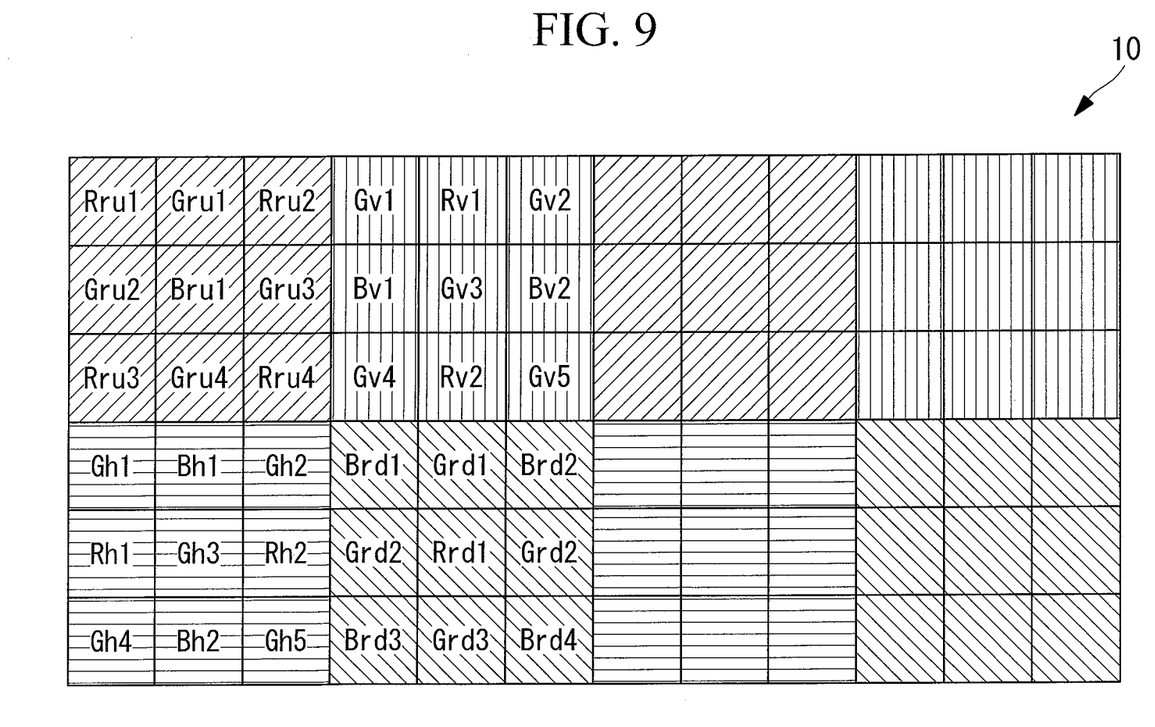
FIG. 9 is a diagram showing the polarization states and color information obtained in regions of an image-acquisition device corresponding to the microlens array in FIG. 8.

By doing so, when 3×3=9 pixels exist in the region corresponding to each microlens, for example, information such as that shown in FIG. 9 is obtained.

In FIG. 9, Rrui (i=1 to 4), Gruj (j=1 to 4), and Bru1 are pixels of the same polarization state having three types of color information.

In this case, interpolation of the color information at each microlens 9a should be performed, followed by interpolation processing of the polarization state in each region of the microlens 9a. The interpolation processing is the same as that described above.

Accordingly, a twelve-plane image signal similar to that described above can be created, and distance measurement can be performed on the basis thereof.

The above-described embodiment leads to the following inventions.

An aspect of the present invention provides an image-acquisition apparatus including an image-acquisition lens that collects light coming from a subject; an image-acquisition device that acquires an image with the light collected by the image-acquisition lens; a microlens array that is disposed between the image-acquisition device and the image-acquisition lens; and a distance calculating portion that calculates a distance to the subject by using information obtained by the image-acquisition device; wherein the microlens array has a plurality of types of microlenses, for different polarization states, that focus light incident thereon to form individual images on an image-acquisition surface of the image-acquisition device and that are arranged in an array in directions orthogonal to an optical axis thereof, and the distance calculating portion calculates the distance by performing matching processing in which each polarization state is weighted according to frequency components in the information obtained by the image-acquisition device.

With this aspect, the light coming from the subject and collected by the image-acquisition lens becomes light of a different polarization state when passing through each microlens and is focused, forming an image on the image-acquisition surface of the image-acquisition device, thereby obtaining a plurality of images of the subject having different polarization states and parallax at each microlens. Therefore, with the distance calculating portion, it is possible to calculate the distance to the subject by using the positional relationship between the image-acquisition lens, the microlenses, and the image-acquisition device by performing matching processing of the plurality of images having parallax.

In this case, at the distance calculating portion, since each polarization state is weighted according to the frequency components in the information obtained by the image-acquisition device and matching processing is performed, rather than handling all of the polarization states equally, it is possible to perform the matching processing with larger weights for polarization states containing a lot of texture information, which increases the matching precision and allows the distance to be calculated with greater precision.

In the above-described aspect, the image-acquisition device may be a color image-acquisition device in which a plurality of color filters are arrayed on an image-acquisition surface thereof in regions corresponding to individual microlenses.

By doing so, in each image obtained in correspondence with each microlens, it is possible to obtain an image provided with a plurality of types of color information, and it is also possible to obtain a color image at the same time as the distance to the subject is calculated.

Another aspect of the present invention provides an image-acquisition apparatus including an image-acquisition lens that collects light coming from a subject; a polarized-light image-acquisition device that acquires an image, for each of a plurality of polarized-light components, with the light collected by the image-acquisition lens; a microlens array that is disposed between the polarized-light image-acquisition device and the image-acquisition lens; and a distance calculating portion that calculates a distance to the subject by using information obtained by the polarized-light image-acquisition device, wherein the microlens array has a plurality of microlenses that focus light incident thereon to form individual images on an image-acquisition surface of the image-acquisition device, the microlenses being arranged in an array in directions orthogonal to an optical axis thereof, and the distance calculating portion calculates the distance by performing matching processing in which each polarization state is weighted according to frequency components in the information obtained by the polarized-light image-acquisition device.

With this aspect, the light coming from the subject and collected by the image-acquisition lens is focused by each microlens to form an image on the image-acquisition surface of the polarized-light image-acquisition device, thereby obtaining a plurality of images of the subject having parallax, as well as a plurality of polarization states, at each microlens. Therefore, with the distance calculating portion, it is possible to calculate the distance to the subject by using the positional relationship between the image-acquisition lens, the microlenses, and the image-acquisition device by performing matching processing of the plurality of images having parallax.

In this case, at the distance calculating portion, since each polarization state is weighted according to the frequency components in the information obtained by the polarized-light image-acquisition device and matching processing is performed, rather than handling all of the polarization states equally, it is possible to perform the matching processing with larger weights for polarization states containing a lot of texture information, which increases the matching precision and allows the distance to be calculated with greater precision.

In the above-described aspect, the microlens array may have a plurality of types of microlenses with different wavelength transmittances arranged in an array in directions orthogonal to the optical axis.

By doing so, the light coming from the subject and collected by the image-acquisition lens is given different types of color information when passing through each microlens. Therefore, in each image obtained in correspondence with each microlens, an image provided with a different type of color information can be obtained, and it is also possible to obtain a color image at the same time as the distance to the subject is calculated.

REFERENCE SIGNS LIST

A subject
1 image-acquisition apparatus
7 image-acquisition lens
9 microlens array
9a microlens
10 image-acquisition device
16 distance-information calculating portion (distance calculating portion)

The invention claimed is:

1. An image-acquisition apparatus comprising:
an image-acquisition lens that collects light coming from a subject;
an image-acquisition device that acquires an image with the light collected by the image-acquisition lens;
a microlens array that is disposed between the image-acquisition device and the image-acquisition lens, that includes a plurality of types of microlenses with different polarization states arranged in an array in directions orthogonal to an optical axis of the microlens array, and that focuses light incident on the microlens array from the image-acquisition lens to form individual images on an image-acquisition surface of the image-acquisition device; and
a distance calculating portion that calculates a distance to the subject by using information obtained by the image-acquisition device;
wherein the image-acquisition device acquires images of the light focused by the microlens array to obtain image signals having a plurality of polarization states,
wherein the distance calculating portion calculates the distance to the subject by using parallax calculated by performing matching processing of a pixel included in a pixel region corresponding to one of the plurality of types of microlenses and a pixel included in a pixel region corresponding to another one of the plurality of types of microlenses, and
wherein, in the matching processing:
for brightness information of an image signal obtained by the image-acquisition device, an edge quantity for each of the plurality of polarization states is calculated for each pixel;
a weighting coefficient is decided based on the edge quantity for each of the plurality of polarization states; and
the weighting coefficient is set to a larger value as a magnitude of the edge quantity increases, and the weighting coefficient is set to a smaller value as the magnitude of the edge quantity decreases.

2. The image-acquisition apparatus according to claim 1, wherein the image-acquisition device is a color image-acquisition device in which a plurality of color filters are arrayed on the image-acquisition surface thereof in regions corresponding to individual microlenses.

3. The image-acquisition apparatus according to claim 1, wherein the distance calculating portion performs the matching processing on pixel regions corresponding to microlenses that are in a vicinity of the one of the plurality of types of microlenses.

4. The image-acquisition apparatus according to claim 1, wherein the distance calculating portion performs the matching processing on pixel regions corresponding to microlenses that are adjacent to the one of the plurality of types of microlenses.

5. The image-acquisition apparatus according to claim 1, wherein:
the plurality of the polarization states are four polarization states; and
polarization directions of the four polarization states are different from each other.

* * * * *